United States Patent
Hsieh et al.

(10) Patent No.: US 9,082,862 B2
(45) Date of Patent: Jul. 14, 2015

(54) OXIDE SEMICONDUCTOR COMPOSITION AND MANUFACTURING METHOD THEREOF, OXIDE THIN FILM TRANSISTOR AND MANUFACTURING METHOD THEREOF

(71) Applicant: Chunghwa Picture Tubes, LTD., Taoyuan (TW)

(72) Inventors: Chia-Sheng Hsieh, Taichung (TW);
Jan-Tian Lian, Keelung (TW);
Hung-Yu Wu, New Taipei (TW);
Hsin-Min Fu, Taoyuan County (TW);
Jang-Jeng Liang, New Taipei (TW)

(73) Assignee: Chunghwa Picture Tubes, LTD., Taoyuan (TW)

( * ) Notice: Subject to any disclaimer, the term of this patent is extended or adjusted under 35 U.S.C. 154(b) by 0 days.

(21) Appl. No.: 14/109,967

(22) Filed: Dec. 18, 2013

(65) Prior Publication Data
US 2015/0123110 A1    May 7, 2015

(30) Foreign Application Priority Data
Nov. 1, 2013   (TW) ............... 102139745 A

(51) Int. Cl.
*H01L 29/10* (2006.01)
*H01L 29/786* (2006.01)
*H01L 29/66* (2006.01)

(52) U.S. Cl.
CPC ...... *H01L 29/7869* (2013.01); *H01L 29/66969* (2013.01)

(58) Field of Classification Search
CPC ................ H01L 21/02376; H01L 29/0676
USPC ........................................................ 257/43
See application file for complete search history.

(56) References Cited

U.S. PATENT DOCUMENTS

2010/0081057 A1*  4/2010  Liu et al. .................... 429/231.5

OTHER PUBLICATIONS

High-performance transparent and flexible inorganic thin film transistors: a facile integration of graphene nanosheets and amorphous InGaZnO, Min-Kun Dai,a Jan-Tien Lian,b Tai-Yuan Lin*b and Yang-Fang Chen, J. Mater. Chem. C, 2013, 1, 5064.*

* cited by examiner

*Primary Examiner* — Mohammad Islam
*Assistant Examiner* — Ankush Singal
(74) *Attorney, Agent, or Firm* — Jianq Chyun IP Office

(57) ABSTRACT

An oxide semiconductor composition comprises graphene, a metal oxide precursor, and a solvent. Based on a total weight of the oxide semiconductor composition, a concentration of the graphene is between 0.01 and 10 wt %, a concentration of the metal oxide is between 0.01 and 30 wt %, and a concentration of the solvent is between 60 and 99.98 wt %.

15 Claims, 4 Drawing Sheets

OXIDE SEMICONDUCTOR COMPOSITION AND MANUFACTURING METHOD THEREOF, OXIDE THIN FILM TRANSISTOR AND MANUFACTURING METHOD THEREOF

CROSS-REFERENCE TO RELATED APPLICATION

This application claims the priority benefit of Taiwan application serial no. 102139745, filed on Nov. 1, 2013. The entirety of the above-mentioned patent application is hereby incorporated by reference herein and made a part of this specification.

BACKGROUND

1. Field of the Invention

The invention is directed to a semiconductor composition and a manufacturing method thereof, and a thin film transistor and a manufacturing method thereof. More particularly, the invention is directed to an oxide semiconductor composition and a manufacturing method thereof, an oxide thin film transistor (oxide TFT) and a manufacturing method thereof.

2. Description of Related Art

Along with the development of display technologies, our daily life has been made more convenient with the help of various displays. With the demand to light-weighted and slim displays, flat panel display (FPD) has become mainstream display. Among all FPDs, liquid crystal display (LCD) is the most popular one thanks to its many advantages such as high space efficiency, low power consumption, zero radiation, and low electromagnetic interference. Generally, a grayscale voltage of liquid crystal molecules can be control through a thin film transistor (TFT) to display an image. The TFT has a semiconductor layer that can effectively control signal transmission speed.

A channel current (Ion) of the TFT is proportional to a ratio of a width to a length of the semiconductor, i.e., Ion=U*W/L(VG−Vth)VD. Therein, U represents carrier mobility, W represents a channel width, L represents a channel length, VG represents a gate voltage, Vth represents a threshold voltage, and VD represents a drain voltage. Thus, the channel current may be increased by means of increasing the width of the semiconductor layer. Nevertheless, increasing the width of the semiconductor layer commonly affects the layout of devices, such as leads to decrease in aperture ratio.

In addition, currently, more and more attention has been drawn toward technologies with respect to flexible panels. However, the semiconductor layer of a conventional TFT is typically made of a material having poor ductility, such as metal or amorphous silicon, and as a result, when the conventional TFT is applied to a flexible panel, cracks commonly occur in the TFT, which lead to issues that images can not normally displayed.

SUMMARY

The invention provides an oxide semiconductor composition including graphene and metal oxide. An oxide semiconductor layer manufactured therefrom can provide good carrier mobility and good ductility.

The invention provides a manufacturing method of an oxide semiconductor composition, which includes the following steps. A metal oxide precursor, graphene and a solvent are mixed to form an oxide semiconductor composition. The metal oxide precursor and the solvent form a metal oxide solution, and the graphene is distributed in the metal oxide solution. Based on a total weight of the oxide semiconductor composition, a concentration of the graphene is 0.01 to 10 wt %, a concentration of the metal oxide precursor is 0.01 to 30 wt %, and a concentration of the solvent is 60 to 99.98 wt %.

The invention provides an oxide semiconductor composition including graphene, metal oxide and a solvent. Based on a total weight of the oxide semiconductor composition, a concentration of the graphene is 0.01 to 10 wt %, a concentration of the metal oxide precursor is 0.01 to 30 wt %, and a concentration of the solvent is 60 to 99.98 wt %.

The invention provides a manufacturing method of an oxide thin film transistor (oxide TFT), which includes the following steps. A metal oxide precursor, graphene and a solvent are mixed to form an oxide semiconductor composition. The metal oxide precursor and the solvent form a metal oxide solution, and the graphene is distributed in the metal oxide solution. Based on a total weight of the oxide semiconductor composition, a concentration of the graphene is 0.01 to 10 wt %, a concentration of the metal oxide precursor is 0.01 to 30 wt %, and a concentration of the solvent is 60 to 99.98 wt %. The oxide semiconductor composition is provided on a substrate, and oxide semiconductor composition is solidified to form an oxide semiconductor layer. A source, a drain and a gate are formed. The oxide semiconductor layer is located between the source and the gate and located between the drain and the gate.

The invention further provides an oxide TFT including a source, a drain, a gate and an oxide semiconductor layer. The oxide semiconductor layer is located between the source and the gate and located between the drain and the gate. The oxide semiconductor layer includes a metal oxide layer and graphene, and the graphene is distributed in the metal oxide layer.

Based on the above, the oxide semiconductor layer formed by the semiconductor composition has good carrier mobility and good ductility. Thereby, the oxide TFT having the oxide semiconductor layer can have good device characteristics and good element reliability.

In order to make the aforementioned and other features and advantages of the invention more comprehensible, several embodiments accompanied with figures are described in detail below.

DESCRIPTION OF EMBODIMENTS

Figure 1A:
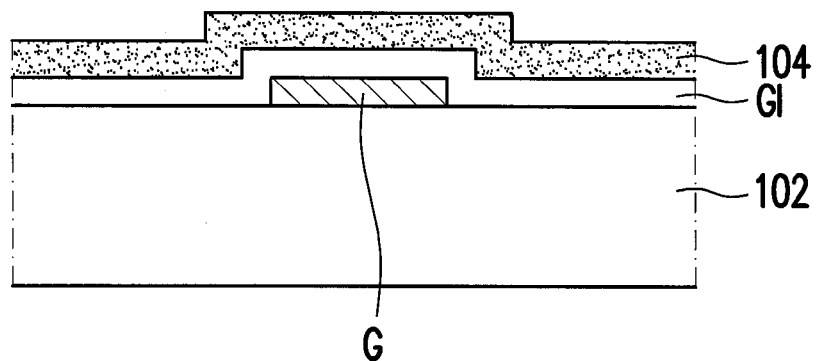
FIG. 1A through FIG. 1C are schematic diagrams illustrating a manufacturing process of an oxide thin film transistor (oxide TFT) according to an embodiment of the invention.
Figure 1B:
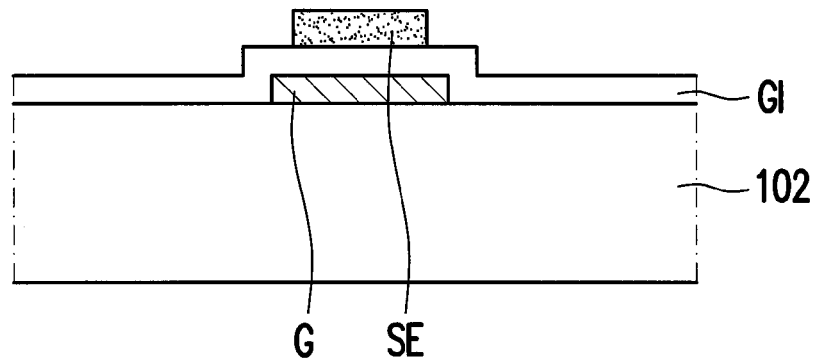
Figure 1C:
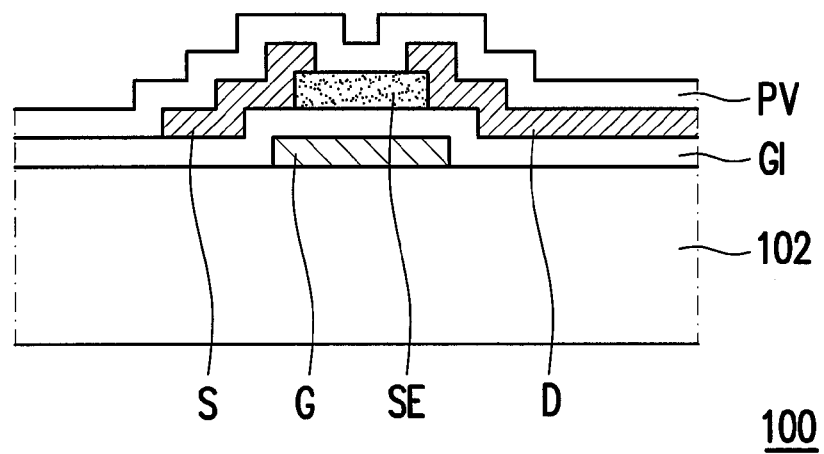

FIG. 1A through FIG. 1C are schematic diagrams illustrating a manufacturing process of an oxide thin film transistor (oxide TFT) according to an embodiment of the invention. First, referring to FIG. 1A, a gate G, a gate insulation layer GI and a semiconductor material layer 104 are subsequently formed on a substrate 102.

The substrate 102 includes a rigid substrate or a flexible substrate. The rigid substrate is, for example, a glass substrate or any other proper rigid substrate. The flexible substrate is, for example, a plastic substrate or any other proper flexible substrate. A method for forming the gate G is, for example, first forming a gate material layer on the substrate 102 and then, patterning the gate material layer to form the gate G. The gate material layer is made of, for example, metal, metal oxide or any other proper material. Thereafter, a gate insulation layer GI is formed on the substrate 102. The gate insulation layer GI covers the substrate 102 and the gate G. The gate insulation layer GI is made of, for example, silicon nitride or any other proper insulating material.

Afterwards, an oxide semiconductor material layer 104 is formed on the substrate 102. To be more specific, a metal oxide precursor may be added in a solvent to form a metal oxide solution, such as a sol-gel solution whose oxygen atoms may be come form the solvent or the air. Then, graphene may be added in the metal oxide solution. The graphene may include, for example, nanosheets and be distributed in the metal oxide solution to form an oxide semiconductor composition. Herein, the graphene may be, for example, added in another solvent to form a graphene solution and the graphene solution is then added in the metal oxide solution. Before manufacturing the oxide semiconductor composition, an ingredient of each reactant used therein is described as follows. Based on a total weight of the oxide semiconductor composition, a concentration of the graphene is 0.01 to 10 wt %, a concentration of the metal oxide precursor is 0.01 to 30 wt %, and a concentration of the solvent is 60 to 99.98 wt %, while in an preferred embodiment, the concentration of the graphene is 0.01 to 3 wt %, the concentration of the metal oxide precursor is 0.01 to 5 wt %, and the concentration of the solvent is 92 to 99.98 wt %.

After manufacturing the oxide semiconductor composition, the ingredient of each product included therein is described as follows. Based on the total weight of the oxide semiconductor composition, the concentration of the graphene is 0.01 to 10 wt %, the concentration of the metal oxide is 0.01 to 30 wt %, and the concentration of the solvent is 60 to 99.98 wt %, while in a preferred embodiment, the concentration of the graphene is 0.01 to 3 wt %, the concentration of the metal oxide is 0.01 to 5 wt %, and the concentration of the solvent is 92 to 99.98 wt %. The graphene is distributed in the metal oxide solution to provide good carrier mobility, the concentration of the graphene is below a certain level, and thus, the formed oxide semiconductor composition may still have semiconductor characteristics.

In the present embodiment, it is illustrated as an example that the graphene is added in the metal oxide solution to form the oxide semiconductor composition after the metal oxide solution is formed by reacting the metal oxide precursor solution, but the invention is not limited thereto. In other embodiments, the graphene, the metal oxide precursor and the solvent may be simultaneously added with one another and reacted to form the oxide semiconductor composition.

Afterwards, the oxide semiconductor composition may be coated on the substrate 102. A method of coating the oxide semiconductor composition on the substrate 102 includes a solution process, such as spin coating process, a roll to roll coating process or the like. Thereafter, the oxide semiconductor composition may be solidified to form the oxide semiconductor material layer 104. Herein, a method of solidifying is, for example, heating. From another aspect, the oxide semiconductor material layer 104 includes a metal oxide layer and graphene nanosheets, and the graphene nanosheets are distributed in the metal oxide layer.

The metal oxide precursor is, for example, a magnesium oxide precursor, an indium oxide precursor, a gallium oxide precursor, a zinc oxide precursor, a tin oxide precursor or any combination thereof. The magnesium oxide precursor is, for example, magnesium oxide, magnesium acetate or magnesium nitrate. The indium oxide precursor is, for example, indium oxide, indium chloride or indium nitrate. The gallium oxide precursor is, for example, gallium oxide, gallium chloride or gallium nitrate. The zinc oxide precursor is, for example, zinc oxide, zinc chloride, zinc acetate or zinc nitrate. The tin oxide precursor is, for example, tin oxide, tin chloride, tin acetate or tin nitrate.

The solvent includes chlorobenzene, n-Hexane, 2-propyl alcohol, 2-butyl alcohol, ethyl acetate, trichloromethane, carbon disulfide, ethylene glycol, 2-methoxyethanol, diethanolamine, acetonitrile or any combination thereof.

Referring to FIG. 1B, a patterning process may be performed on the oxide semiconductor material layer 104 to form an oxide semiconductor layer SE. The oxide semiconductor layer SE is, for example, located on the gate insulation layer GI above the gate G, and the pattering process is, for example, a lithography etching process.

Referring to FIG. 1C, a source S, a drain D and a protective layer PV are formed. To be more specific, a method of forming the source S and the drain D is, for example, forming a source/drain material layer on the substrate 102 and then, patterning the source/drain material layer to form the source S and the drain D. The source/drain material layer is made of, for example, metal, metal oxide or any other proper material. The source S and the drain D are partially disposed on the oxide semiconductor layer SE and separated from each other. Up to this step, an oxide TFT 100 is initially manufactured. Thereafter, the protective layer PV may be selectively formed to cover the gate G, the source S, the drain D and the oxide semiconductor layer SE. In this case, a structure of a bottom gate type thin film transistor is illustrated as an example. However, the invention is not limited thereto. The oxide semiconductor composition of the present embodiment may also be applied to manufacture the oxide semiconductor layer of a top gate type thin film transistor.

In the present embodiment, the oxide semiconductor composition is manufactured using the solution process, coated on the substrate by the spin coating process or the roll to roll coating process and used to form the oxide semiconductor material layer 104 by being solidified, without using any complex equipment, and thus, the manufacturing process is simple to save manufacturing cost. Moreover, when manufacturing the oxide semiconductor composition using the solution process, a proportion of each ingredient of the oxide semiconductor composition can be precisely controlled.

Manufacturing of the Oxide Semiconductor Composition

Indium chloride ($InCl_3$, made by Sigma-Aldrich, Inc.), gallium chloride ($GaCl_3$, made by Sigma-Aldrich, Inc.) and zinc chloride ($ZnCl_2$, made by Sigma-Aldrich, Inc.) are dissolved in ethylene glycol ($C_2H_6O_2$, made by Sigma-Aldrich, Inc.) under 75° C. to form an indium-gallium-zinc oxide (IGZO) sol-gel solution. Therein, a stoichiometric molar ratio of the gallium chloride to the zinc chloride to the indium oxide is 1:1:1. Then, the graphene solution and the IGZO sol-gel solution are mixed and stirred under 50° C. for one hour to complete the manufacturing of the oxide semiconductor composition. Thereafter, a thin film transistor (TFT) of Example 1 is manufactured using the oxide semiconductor composition as a material. A structure of the TFT of Example 1 is illustrated in FIG. 2.

Characteristic Test of the Oxide TFT

Figure 2:
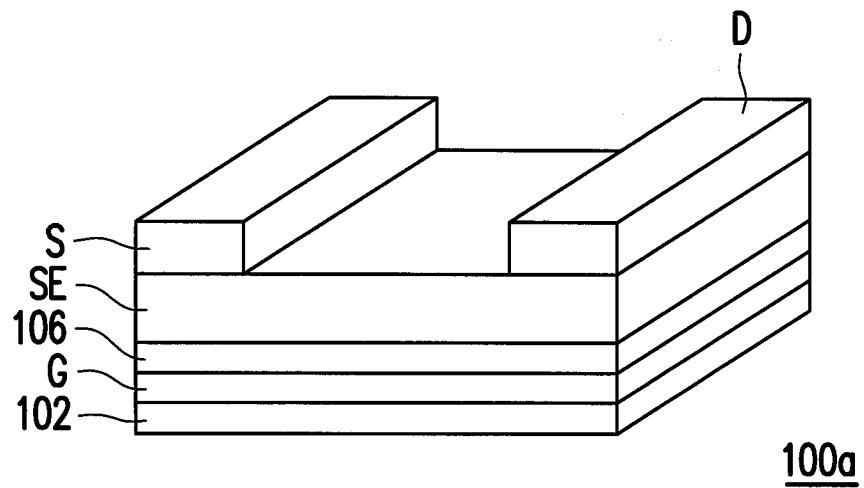
FIG. 2 is a schematic diagram illustrating a structure of an oxide TFT of Example 1.
Figure 3:
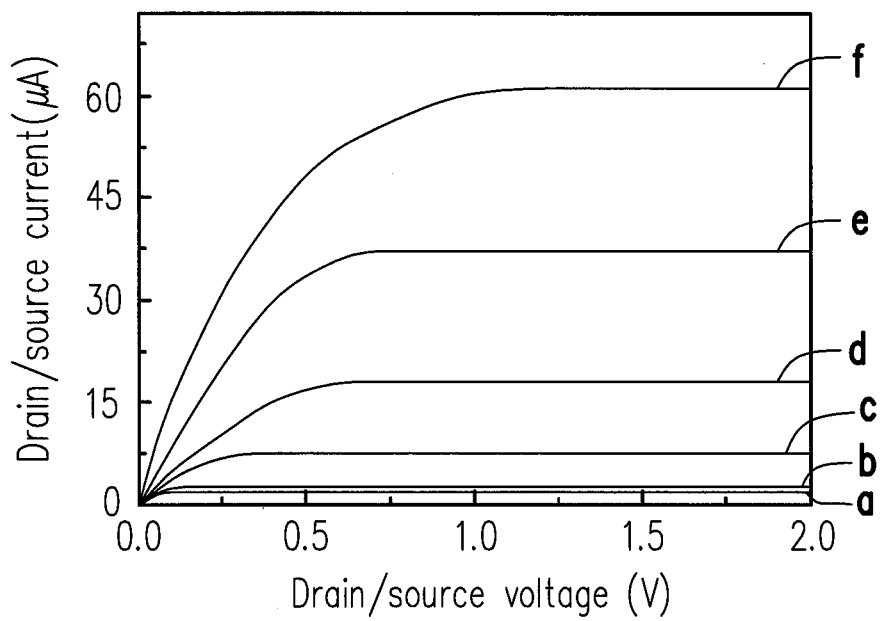
FIG. 3 is a relational graph of a drain/source current to drain/source voltage of the oxide TFT of Example 1.
Figure 4:
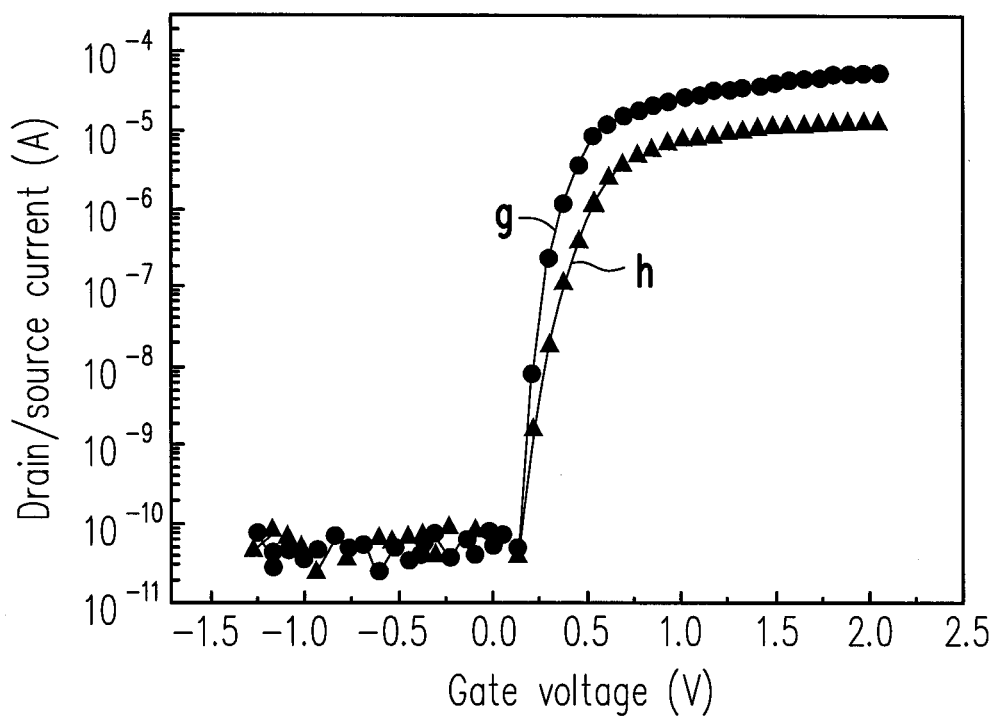
FIG. 4 is a relational graph of the drain/source current to a gate voltage of the oxide TFT of Example 1.

FIG. 2 is a schematic diagram illustrating a structure of an oxide TFT of Example 1. Referring to FIG. 2, a thin film transistor (TFT) 100a has a structure similar to the TFT 100 illustrated in FIG. 1C, in which the substrate 102 is, for example, a flexible substrate. Additionally, the TFT 100a includes a dielectric layer 106. The dielectric layer 106 is located between the gate G and the oxide semiconductor layer SE. The oxide semiconductor layer SE is made of the oxide semiconductor composition containing the graphene and the IGZO. FIG. 3 is a relational graph of a drain/source current to drain/source voltage of the oxide TFT of Example 1 where curves a through f respectively represent that gate voltages are 0 V, 0.3 V, 0.6 V, 0.9 V, 1.2 V and 1.5 V. FIG. 4 is a relational graph of the drain/source current to a gate voltage of the oxide TFT of Example 1 where curves g and h respectively represent that drain/source voltages are 2.1 V and 0.1 V. Referring to FIG. 3 and FIG. 4, the oxide TFT of Example 1 has good device characteristics.

Figure 5:
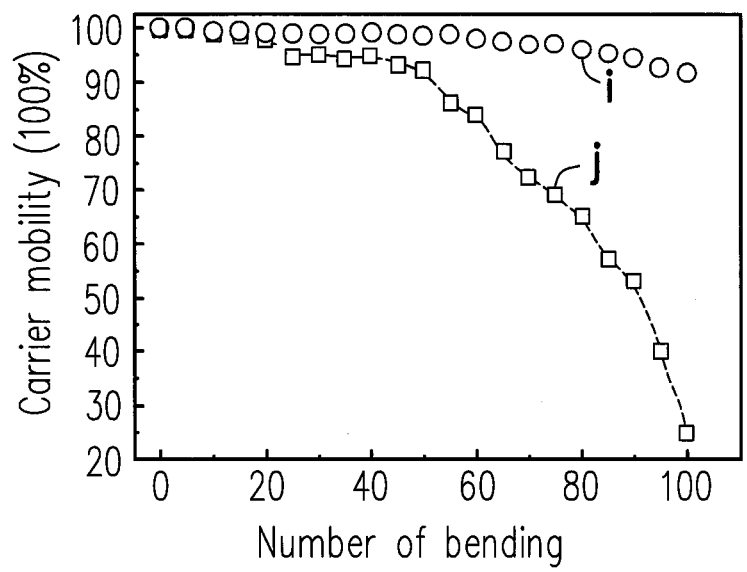
FIG. 5 is a relational graph of the carrier mobility to numbers of bending for the oxide TFT of Example 1 and the conventional oxide TFT.

Afterwards, carrier mobility of the oxide TFT of Example 1 is measured after the oxide TFT is bended. FIG. 5 is a relational graph of the carrier mobility to numbers of bending for the oxide TFT of Example 1 and the conventional oxide TFT. Curves i and j respectively represent Example 1 and the conventional oxide TFT. The oxide semiconductor layer of the conventional oxide TFT includes the IGZO but not the graphene. Referring to FIG. 5, the oxide TFT of Example 1 may be capable of having higher carrier mobility after being bended for many times. In other words, the oxide semiconductor layer of the oxide TFT of Example 1 has better ductility, and thus, the oxide TFT of Example 1 has better flexibility and may be adapted to be applied in a flexible electronic apparatus.

Figure 6:
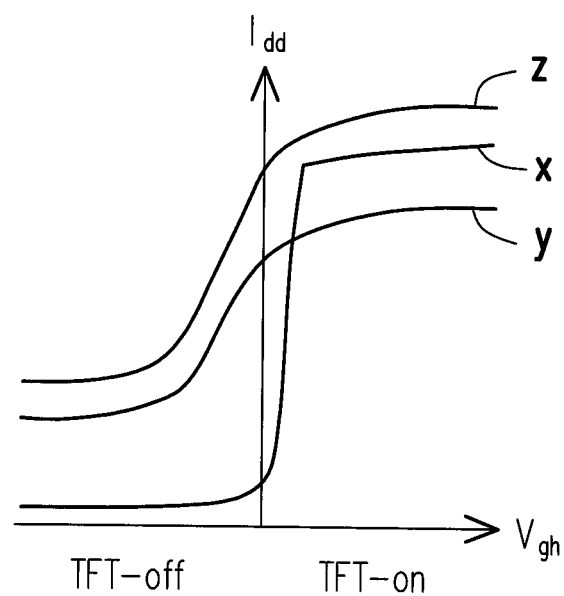
FIG. 6 is a relational graph of drain output currents ($I_{dd}$) to gate driver turn-on voltages ($V_{gh}$) for the oxide TFT of Example 1, an amorphous silicon thin film transistor (a-Si TFT) and a low temperature poly-silicon thin film transistor (LTPS-TFT).

Table 1 shows a result of each characteristic of the oxide TFT of Example 1, the a-Si TFT and the LTPS-TFT. FIG. 6 is a relational graph of drain output currents (Idd) to gate driver turn-on voltages (Vgh) for the oxide TFT of Example 1, an amorphous silicon thin film transistor (a-Si TFT) and a low temperature poly-silicon thin film transistor (LTPS-TFT), where curves x, y and z respectively represent the oxide TFT of Example 1, the a-Si TFT and the LTPS-TFT. In this case, the a-Si TFT have the same structure with the oxide TFT of Example 1, and the semiconductor layer of the a-Si TFT is made of amorphous silicon.

Referring to Table 1 and FIG. 6, the TFT of Example 1 has better device characteristics. When being compared with the a-Si TFT (with reference to the curve y), the TFT of Example 1 (with reference to the curve x) has a greater turn-one current. When being compared with the a-Si TFT (with reference to the curve y) and with the LTPS-TFT (with reference to the curve z), the TFT of Example 1 has less leakage current which is less than 1 pico-ampere (pA). In other words, the TFT of Example 1 has lower power consumption.

TABLE 1

|  | Example 1 | a-Si TFT | LTPS-TFT |
| --- | --- | --- | --- |
| Carrier mobility | 10-100 cm$^2$/Vs | 1 cm$^2$/Vs | 50-100 cm$^2$/Vs |
| On/Off | 0.09-0.6 V/dec | 0.4-0.5 V/dec | 0.2-0.3 V/dec |

TABLE 1-continued

|  | Example 1 | a-Si TFT | LTPS-TFT |
| --- | --- | --- | --- |
| characteristics (Subthreshold swing) |  |  |  |
| Leakage current | 10$^{-13}$ A (highest) | About 10$^{-12}$ A | About 10$^{-12}$ A |
| Number of photomasks | 4-5 | 4-5 | 5-9 |
| Manufacturing cost | Low | Low | High |
| Process temperature | A room temperature to 350° C. | About 250° C. | — |
| Solution process | Can be performed | Cannot be performed | Laser annealing |

In view of the foregoing, the oxide semiconductor layer formed by the semiconductor composition of the invention has good carrier mobility and good ductility. Thus, the oxide TFT containing the oxide semiconductor layer can have good device characteristics and reliability. Moreover, the manufacturing of the oxide semiconductor layer can be further completed using the solution process to coat the semiconductor composition, and thereby, the manufacturing process is simple so as to save the manufacturing cost.

What is claimed is:

1. A manufacturing method of preparing an oxide semiconductor composition, comprising following steps:
   mixing a metal oxide precursor, graphene and a solvent to form the oxide semiconductor composition,
   wherein the metal oxide precursor and the solvent form a metal oxide solution, the graphene is distributed in the metal oxide solution, based on a total weight of the oxide semiconductor composition, a concentration of the graphene is 0.01 to 10 wt %, a concentration of the metal oxide precursor is 0.01 to 30 wt %, and a concentration of the solvent is 60 to 99.98 wt %.

2. The manufacturing method according to claim 1, wherein the step of mixing the metal oxide precursor, the graphene and the solvent comprises:
   mixing the metal oxide precursor and the solvent to form the metal oxide solution, and then adding the graphene into the metal oxide solution.

3. The manufacturing method according to claim 1, wherein the step of mixing the metal oxide precursor, the graphene and the solvent comprises:
   simultaneously mixing the metal oxide precursor, the graphene and the solvent.

4. The manufacturing method according to claim 1, wherein the metal oxide precursor comprises a magnesium oxide precursor, an indium oxide precursor, a gallium oxide precursor, a zinc oxide precursor, a tin oxide precursor or any combination thereof.

5. The manufacturing method according to claim 1, wherein the step of forming the metal oxide solution comprises:
   adding an indium oxide precursor, a gallium oxide precursor and a zinc oxide precursor into the solvent to form an indium gallium zinc oxide (IGZO) solution.

6. The manufacturing method according to claim 5, wherein a stoichiometric molar ratio of the indium oxide precursor to the gallium oxide precursor to zinc oxide precursor is 1:1:1.

7. The manufacturing method according to claim 1, wherein the metal oxide precursor comprises magnesium oxide, magnesium acetate, magnesium nitrate, indium oxide, indium chloride, indium nitrate, gallium oxide, gallium chloride, gallium nitrate, zinc oxide, zinc chloride, zinc acetate, zinc nitrate, tin oxide, tin chloride, tin acetate, tin nitrate or any combination thereof.

8. An oxide semiconductor composition prepared by the method according to claim 6.

9. An oxide semiconductor composition, comprising:
graphene;
a metal oxide; and
a solvent, wherein based on a total weight of the oxide semiconductor composition, a concentration of the graphene is 0.01 to 10 wt %, a concentration of the metal oxide precursor is 0.01 to 30 wt %, and a concentration of the solvent is 60 to 99.98 wt %.

10. A manufacturing method of preparing an oxide thin film transistor (oxide TFT), comprising following steps:
mixing a metal oxide precursor, graphene and a solvent to form the oxide semiconductor composition,
wherein the metal oxide precursor and the solvent form a metal oxide solution, the graphene is distributed in the metal oxide solution, based on a total weight of the oxide semiconductor composition, a concentration of the graphene is 0.01 to 10 wt %, a concentration of the metal oxide precursor is 0.01 to 30 wt %, and a concentration of the solvent is 60 to 99.98 wt %;
providing the oxide semiconductor composition on a substrate and solidifying the oxide semiconductor composition to form a oxide semiconductor layer; and
forming a source, a drain and a gate, wherein the oxide semiconductor layer is located between the source and the gate and located between the drain and the gate.

11. The manufacturing method according to claim 10, the step of providing the oxide semiconductor composition on the substrate comprises spin coating process or a roll to roll coating process.

12. The manufacturing method according to claim 10, wherein the metal oxide precursor comprises a magnesium oxide precursor, an indium oxide precursor, a gallium oxide precursor, a zinc oxide precursor, a tin oxide precursor or any combination thereof.

13. The manufacturing method according to claim 10, wherein the step of forming the metal oxide solution comprises:
adding an indium oxide precursor, a gallium oxide precursor and a zinc oxide precursor into the solvent to form an IGZO solution.

14. The manufacturing method according to claim 13, wherein a stoichiometric molar ratio of the indium oxide precursor to the gallium oxide precursor to zinc oxide precursor is 1:1:1.

15. The manufacturing method according to claim 10, wherein the metal oxide precursor comprises magnesium oxide, magnesium acetate, magnesium nitrate, indium oxide, indium chloride, indium nitrate, gallium oxide, gallium chloride, gallium nitrate, zinc oxide, zinc chloride, zinc acetate, zinc nitrate, tin oxide, tin chloride, tin acetate, tin nitrate or any combination thereof.

* * * * *